United States Patent
Yang et al.

(10) Patent No.: US 10,082,732 B2
(45) Date of Patent: Sep. 25, 2018

(54) ELECTRONIC DEVICE CASE AND SURFACE TREATMENT METHOD THEREOF

(71) Applicant: Samsung Electronics Co., Ltd., Suwon-si, Gyeonggi-do (KR)

(72) Inventors: Kyungmo Yang, Suwon-si (KR); Kiwoong Kim, Yongin-si (KR); Kwangsu Seo, Suwon-si (KR); Sungjae Lee, Yongin-si (KR); Yongwoo Jeon, Suwon-si (KR); Wonhee Choi, Seoul (KR); Byounguk Yoon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 868 days.

(21) Appl. No.: 14/280,900

(22) Filed: May 19, 2014

(65) Prior Publication Data

US 2014/0356563 A1    Dec. 4, 2014

(30) Foreign Application Priority Data

May 31, 2013    (KR) .................. 10-2013-0062370

(51) Int. Cl.
*G03F 7/00* (2006.01)
*G03F 7/20* (2006.01)
*B29C 37/00* (2006.01)
*B29C 43/02* (2006.01)
*B29C 43/18* (2006.01)
(Continued)

(52) U.S. Cl.
CPC ........ *G03F 7/0002* (2013.01); *B29C 35/0805* (2013.01); *B29C 37/0053* (2013.01); *B29C 43/021* (2013.01); *B29C 43/18* (2013.01); *B29C 45/1679* (2013.01); *G03F 7/20* (2013.01); *H05K 5/03* (2013.01); *B29C 2035/0827* (2013.01); *B29C 2037/0035* (2013.01); *B29C 2037/0042* (2013.01); *H04M 1/0283* (2013.01); *Y10T 428/13* (2015.01); *Y10T 428/1352* (2015.01)

(58) Field of Classification Search
CPC ...................... B29C 59/026; B29C 2059/023; G03F 7/0002
See application file for complete search history.

(56) References Cited

U.S. PATENT DOCUMENTS 4,110,139 A * 8/1978 Mashida .............. A44C 5/0053
156/209
4,643,787 A * 2/1987 Goodman ............. B29C 59/026
156/196

(Continued)

*Primary Examiner* — Benjamin A Schiffman
(74) *Attorney, Agent, or Firm* — Jefferson IP Law, LLP

(57) ABSTRACT

A surface treatment method of an electronic device is provided. The surface treatment method includes processing a first pattern on a surface of a top mold and a second pattern on a surface of a bottom mold, coating a Ultra-Violet (UV) molding liquid on each of a front surface of a raw sheet material and the bottom mold facing a rear surface of the raw sheet material raw, positioning the raw sheet material between the top mold and the bottom mold, pressing the top mold and the bottom mold to each other, curing the UV molding liquid, and separating the raw sheet material from the top mold and the bottom mold and forming a print layer on the front surface and the rear surface of the raw sheet material.

7 Claims, 8 Drawing Sheets

(51) Int. Cl.
*B29C 35/08* (2006.01)
*B29C 45/16* (2006.01)
*H05K 5/03* (2006.01)
*H04M 1/02* (2006.01)

(56) References Cited

U.S. PATENT DOCUMENTS

| | | | | |
|---|---|---|---|---|
| 6,659,759 B2 * | 12/2003 | Anzai | ............... | B29C 59/026 425/174.4 |
| 6,663,935 B1 * | 12/2003 | Kashiwagi | ............ | B29C 59/026 156/230 |
| 7,833,458 B2 * | 11/2010 | Yuzawa | ............. | B29C 37/0003 264/284 |
| 7,955,785 B2 * | 6/2011 | Funada | ................ | B29C 59/022 264/1.31 |
| 8,110,059 B2 * | 2/2012 | Kuwahara | ............. | B29C 43/021 156/245 |
| 8,186,992 B2 * | 5/2012 | Washiya | ............... | B29C 43/021 264/293 |
| 8,377,361 B2 * | 2/2013 | Zhang | .................. | B29C 59/022 264/293 |
| 2002/0074692 A1 * | 6/2002 | Wang | ................. | A47G 27/0225 264/293 |
| 2005/0287341 A1 * | 12/2005 | Nakajima | ............. | B29C 59/022 428/156 |
| 2007/0243475 A1 * | 10/2007 | Funada | ................ | B29C 59/022 430/2 |
| 2007/0296118 A1 * | 12/2007 | Kuwahaha | ............ | B29C 43/021 264/319 |
| 2008/0019083 A1 | 1/2008 | Lim et al. | | |
| 2008/0224359 A1 | 9/2008 | Hsu | | |
| 2009/0243152 A1 * | 10/2009 | Yuzawa | ............. | B29C 37/0003 264/293 |
| 2010/0009127 A1 * | 1/2010 | Kariyada | ............. | B29C 59/022 428/187 |
| 2010/0224359 A1 | 7/2010 | Washiya et al. | | |
| 2010/0285231 A1 * | 11/2010 | Huizinga | ................ | B29C 59/04 427/510 |
| 2011/0057347 A1 * | 3/2011 | Ma | ...................... | B29C 37/0032 264/152 |
| 2011/0236639 A1 * | 9/2011 | Saifullah | ............... | B29C 59/022 428/156 |
| 2011/0242847 A1 * | 10/2011 | Greener | ............... | B29C 43/222 362/619 |

* cited by examiner

ELECTRONIC DEVICE CASE AND SURFACE TREATMENT METHOD THEREOF

CROSS-REFERENCE TO RELATED APPLICATION(S)

This application claims the benefit under 35 U.S.C. § 119(a) of a Korean patent application filed on May 31, 2013 in the Korean Intellectual Property Office and assigned Serial number 10-2013-0062370, the entire disclosure of which is hereby incorporated by reference.

TECHNICAL FIELD

The present disclosure relates to an electronic device case and a treatment method of the same. More particularly, the present disclosure relates to a surface treatment method of an electronic device case which is capable of improving effectiveness of a process for forming the case, expressing a metallic texture, and securing visibility of a pattern while using a non-conductive material for the electronic device case.

BACKGROUND

In recent electronic devices, a design viewpoint has been considerably considered so as to improve a surface appearance thereof. In order to improve a design of an electronic device, setting-up of a color and a texture of a surface appearance acts as a very important factor. In the electronic devices according to the related art, a plastic or metallic texture is expressed or various colors are coated on the cases thereof. However, the recent electronic devices have limitations in expressing various colors and textures (e.g., in providing a look and feel with various colors and textures).

According to the related art, an electronic device case formed through injection molding is formed with a desired pattern for the surface appearance thereof. through a sectional Ultra-Violet (UV) molding method. For example, when a case is formed by a front surface UV molding method, a texture may be expressed due to design elements formed on the front surface of the case but is not sufficient for securing a feeling of depth of the pattern (e.g., visibility). In addition, a case formed through a rear surface UV molding method has a disadvantage in that, although a pattern shape having a feeling of depth of a material may be implemented, expressing (e.g., providing) a texture on the front surface is difficult.

In addition, a surface treatment technology such as conventional coating, deposition, or the like, which allows expression of only one design element, is inadequate to express complex design elements on a case.

Further, considering that electronic devices get thinner and thinner in thickness, a configuration of forming a case also requires a slim material. However, an injection molding according to the related art has a limit in reducing the thickness of the material while expressing (e.g., providing) a metallic texture and securing visibility.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a surface treatment method of an electronic device case in which, even if a non-conductive material is used for the case, a metallic texture may be expressed and a visibility of a pattern may be secured.

Another aspect of the present disclosure is to provide a surface treatment method of an electronic device case in which patterns may be formed on both sides of a raw sheet material for surface treatment of an electronic device case so as to improve effectiveness of a process.

In accordance with an aspect of the present disclosure, a surface treatment method of an electronic device is provided. The surface treatment method includes processing a first pattern on a surface of a top mold and a second pattern on a surface of a bottom mold, coating a Ultra-Violet (UV) molding liquid on each of a front surface of a raw sheet material and the bottom mold facing a rear surface of the raw sheet material raw, positioning the raw sheet material between the top mold and the bottom mold, pressing the top mold and the bottom mold to each other, curing the UV molding liquid, separating the raw sheet material from the top mold and the bottom mold, and forming a print layer on at least one of the front surface and the rear surface of the raw sheet material.

In accordance with another aspect of the present disclosure, a surface treatment method of an electronic device case is provided. The surface treatment method includes coating a UV molding liquid on a primary electroformed mold which is formed with a first pattern, disposing a raw sheet material on the primary electroformed mold coated with the UV molding liquid such that the front surface of the raw sheet material faces the primary electroformed mold, pressing the raw sheet material against the primary electroformed mold, curing UV molding liquid adhered to the front surface of the raw sheet material by the pressing, separating the raw sheet material from the first electroformed mold, coating a UV molding liquid on a secondary electroformed mold which is formed with a second pattern, disposing the raw sheet material on the secondary electroformed mold coated with the UV molding liquid such that the rear surface of the raw sheet material faces the secondary electroformed mold, pressing the raw sheet material against the secondary electroformed mold, curing the UV molding liquid adhered to the rear surface of the raw sheet material by the pressing, separating the raw sheet material from the secondary electroformed mold, and forming a print layer on at least one of the front surface and the rear surface of the raw sheet material.

In accordance with another aspect of the present disclosure, an electronic device case is provided. The electronic device includes a case body and a deco attached to the case body. The deco is made of a raw sheet material which includes, on a surface exposed to the outside, a first pattern that implements a texture based on at least one of a relief form, an intaglio form, and a mixed form thereof, and, on a rear surface, and a second pattern overlapped with the first pattern on a vertical line.

A surface treatment method of an electronic device case according an aspect of the present disclosure may express a metallic texture and secure a visibility of a pattern while using a non-conductive material for the electronic device case.

In accordance with an aspect of the present disclosure, patterns are formed on both sides of a raw sheet material for surface treatment of an electronic device case, thereby improving effectiveness of a process. Further, aspects of the present disclosure enable the production of a product in which patterns of the front surface and the rear surface of the raw sheet material are uniform, thereby giving an esthetic sense (e.g., look and feel) and a three-dimensional effect to electronic device case.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
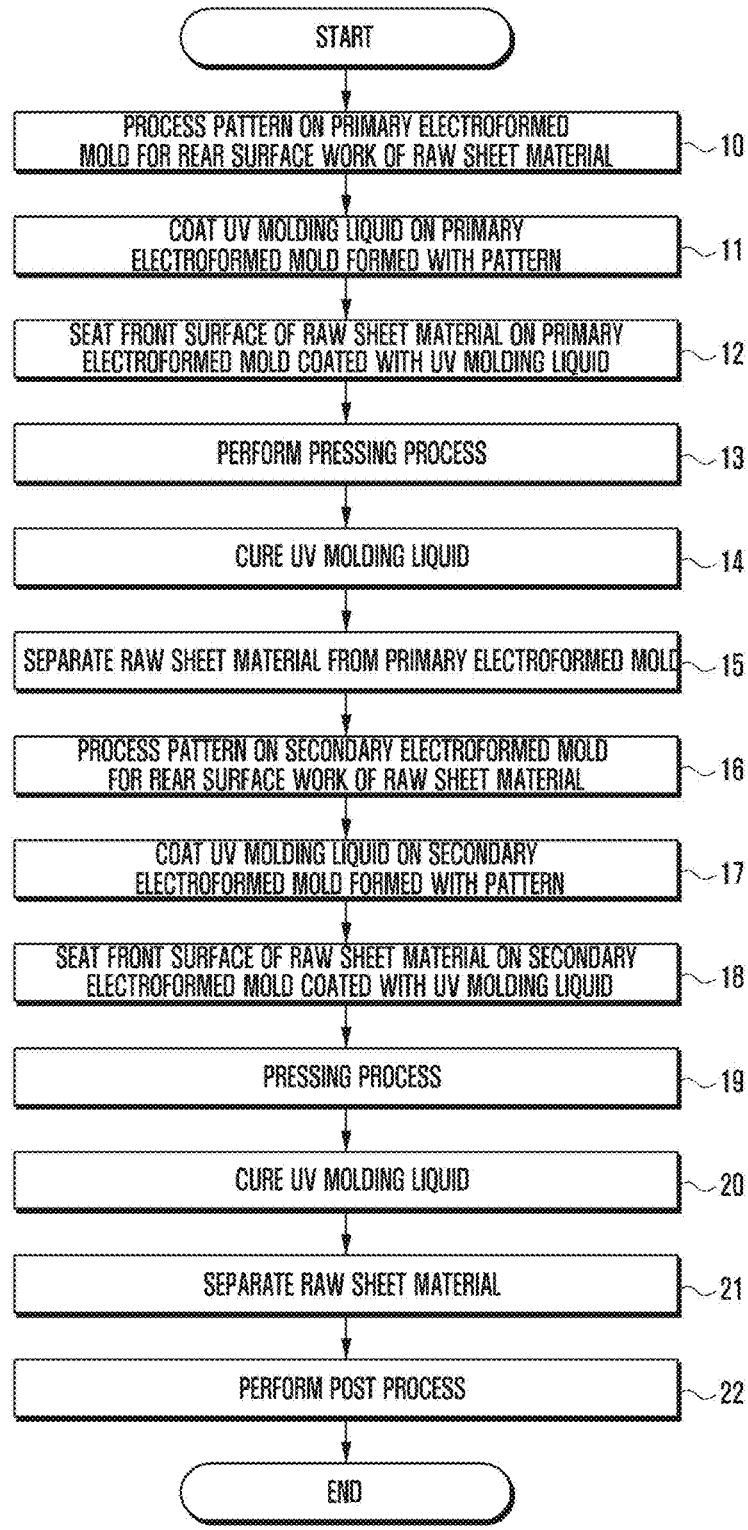
FIG. 1 is a flowchart for describing a surface treatment method of an electronic device case according to an embodiment of the present disclosure.
Figure 2:
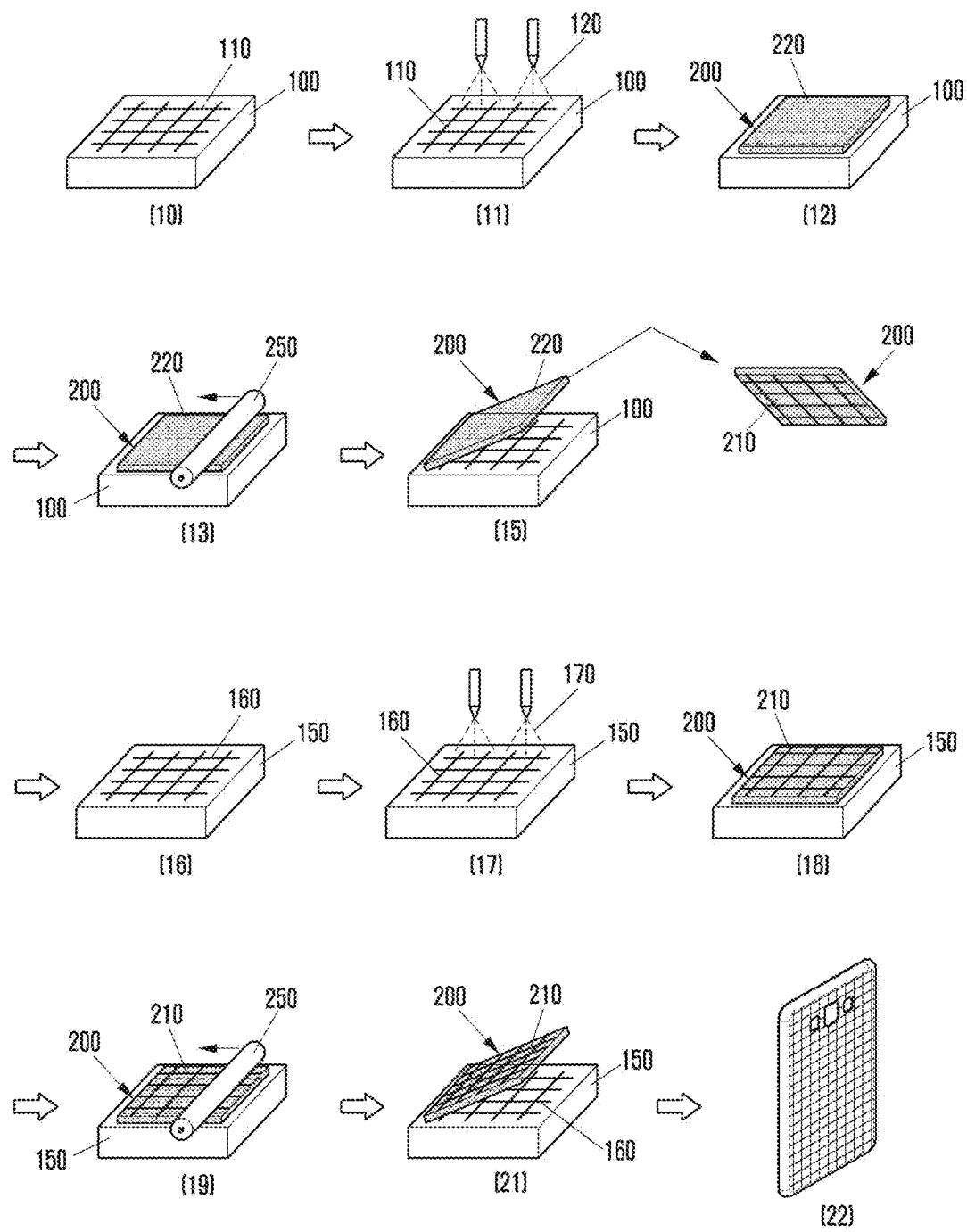
FIG. 2 illustrates a flow of a process for surface treatment of an electronic device case according to an embodiment of the present disclosure.
Figure 3:
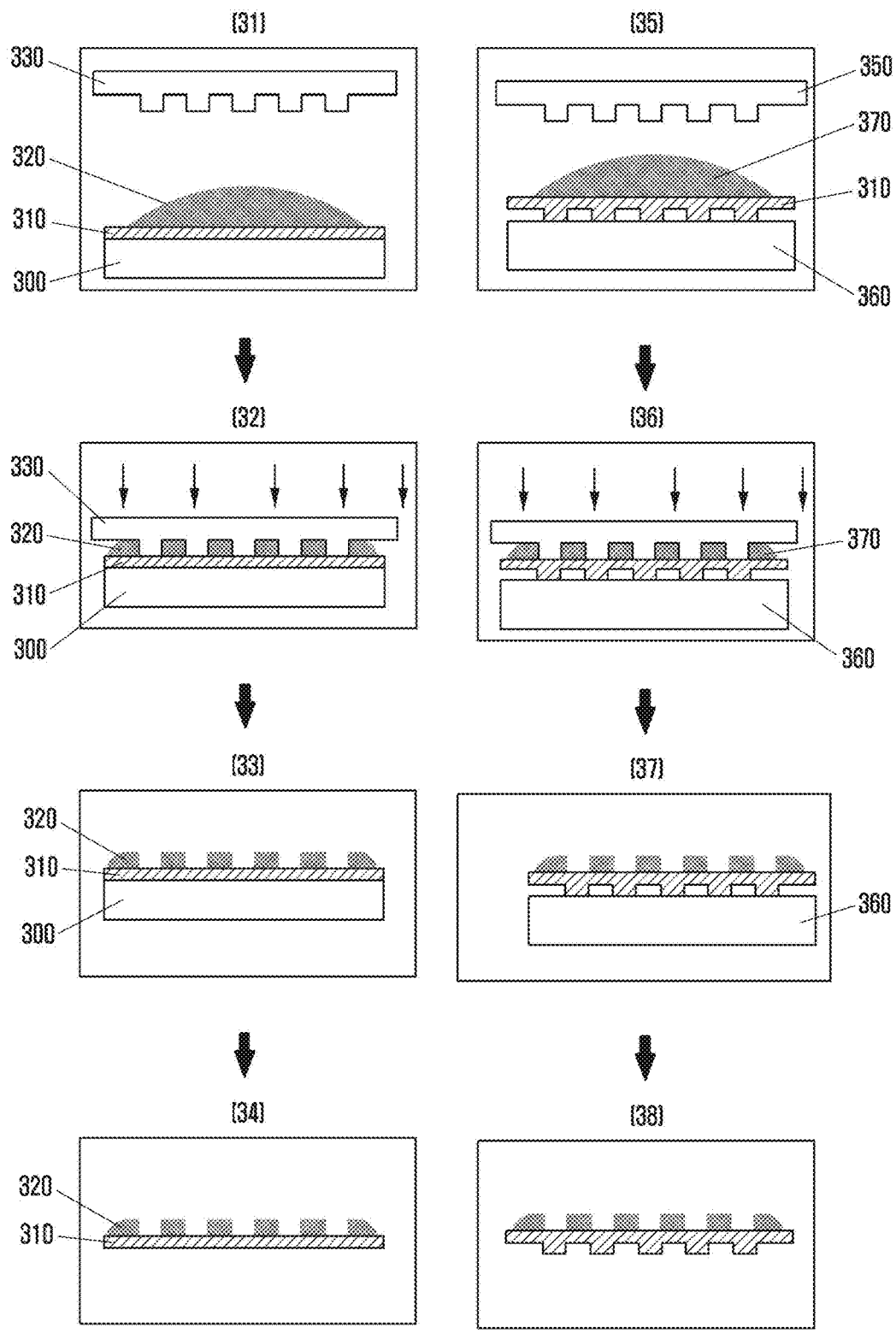
FIG. 3 illustrates a flow of process for surface treatment of an electronic device case according to an embodiment of the present disclosure.

FIG. 1 is a flowchart for describing a surface treatment method of an electronic device case according to an embodiment of the present disclosure. FIG. 2 illustrates a flow of a process for surface treatment of an electronic device case according to an embodiment of the present disclosure. FIG. 3 illustrates a flow of process for surface treatment of an electronic device case according to an embodiment of the present disclosure.

Referring to FIGS. 1 and 2, at operation 10, a surface treatment method of an electronic device case may process a first pattern 110 on a primary electroformed mold 100 for a rear surface work of a raw sheet material.

The raw sheet material may be made of a transparent material formed of any one of PET, PP, PC, PU, acryl, and/or the like. The rear surface 210 of the raw sheet material may be set as a surface to be subsequently attached to a body of the electronic device case. The front surface 220 of the raw sheet material may be set as a surface to be exposed to the outside when the rear surface 210 of the raw sheet material is attached to the body of the electronic device case (e.g., the surface opposite to the rear surface 210).

The first pattern 110 formed on the primary electroformed mold 100 may have a relief form, an intaglio form, or a mixed form thereof formed through electroforming, and may be formed on the whole or a part of the primary electroformed mold 100. The first pattern 110 corresponding to the rear surface of the raw sheet material may include at least one of a check pattern, a hologram (interference pattern), a spin (rotary pattern), a hairline (stripe pattern), and/or the like. An example of an embodiment of the present disclosure in which a check pattern is processed on the primary electroformed mold 100 will be described.

At operation 11, an Ultra-Violet (UV) molding liquid 120 may be coated on the primary electroformed mold 100 on which the first pattern 110 is processed.

The UV molding liquid 120 refers to a material which may have a photochemical reaction with a UV energy (e.g., 100 nm to 400 nm) to be cured from a liquid phase to a solid phase and dried. The UV molding liquid 120 may be instantly cured by instant illumination of UV rays and may form a very excellent film. According to various embodiments of the present disclosure, the UV molding liquid 120 may include of a photo-polymerizable resin (e.g., an oligomer and a reactive diluent), a photo-polymerization initiator, a pigment, auxiliary agents (e.g., a viscosity improvement agent, an oxidation inhibitor, a wetting agent, and a dispersion agent), a polymerization agent, a sensitizer, and/or the like. For example, the UV molding liquid 120 may consist of a photo-polymerizable resin (e.g., an oligomer and a reactive diluent), a photo-polymerization initiator, a pigment, auxiliary agents (e.g., a viscosity improvement agent, an oxidation inhibitor, a wetting agent, and a dispersion agent), a polymerization agent, and a sensitizer.

At operation 12, the raw sheet material 200 may be seated (e.g., disposed) on the primary electroformed mold 100 coated with the UV molding liquid 120. Specifically, the raw sheet material 200 is seated on the primary electroformed mold 100 formed with the first pattern 110 and coated with the UV molding liquid 120 such that the front surface 220 of the raw sheet material 200 faces the primary electroformed mold 100.

At operation 13, a pressing process may be performed. For example, the raw sheet material 200 seated on the primary electroformed mold 100 may be subjected to a pressing process. For example, the pressing process may be performed using a pressing roller 250 in which the pressing roller 250 is pushed over the raw sheet material 200 to flatten the UV molding liquid 120 interposed between the primary electroformed mold 100 and the raw sheet material 200 as well as to cause the UV molding liquid 120 to be closely contacted with the front surface 220 of the raw sheet material 200.

At operation 14, the UV molding liquid 120 may be cured. For example, the pressed raw sheet material 200 and the UV molding liquid 120 may be cured.

The UV molding liquid 120 may be cured through a reaction with UV rays. For example, the UV molding liquid 120 may be cured by illuminating the UV molding liquid 120 with UV rays. When one surface of the UV molding liquid 120 is formed with the first pattern 110 and the other surface of the raw sheet material 200 is cured in a state in which the raw sheet material 200 is closely contacted with the other surface, the UV molding liquid 120 formed with the first pattern 110 may be adhered and bonded to the raw sheet material 200. As a result, a feeling of depth of the first pattern 110 may be implemented on the rear surface 210 of the raw sheet material 200.

At operation 15, the raw sheet material 200 formed with the first pattern 110 may be separated from the primary electroformed mold 100.

A process of forming the first pattern 110 on the rear surface 210 of the raw sheet material has been described with reference to operations 10 to 15. Hereinafter, a process of forming a second pattern on the front surface 220 of the raw sheet material 200 will be described with reference to operations 16 to 21.

Following operation 15, at operation 16, a second pattern 160 may be processed on a secondary electroformed mold 150 for operation on a front surface 220 of the raw sheet material.

The second pattern 160 formed on the secondary electroformed mold 150 may have a relief form, an intaglio form, or a mixed form thereof formed through electroforming, and may be formed on the whole or a part of the primary electroformed mold 150. The second pattern 160 corresponding to the front surface 220 of the raw sheet material may include at least one of a check pattern, a hologram (interference pattern), a spin (rotary pattern), a hairline (stripe pattern), and/or the like. An example of an embodiment of the present disclosure in which a check pattern is processed on the secondary electroformed mold 150 will be described.

At operation 17, a UV molding liquid 170 may be coated on the secondary electroformed mold 150 on which the second pattern 160 is processed.

At operation 18, the raw sheet material 200 may be seated (e.g., disposed) on the secondary electroformed mold 150 coated with the UV molding liquid 170. Specifically, the raw sheet material 200 may be fixed to the secondary electroformed mold 150 formed with the second pattern 160 and coated with the UV molding liquid 170 such that the rear surface 210 of the raw sheet material 200 faces the secondary electroformed mold 150.

At operation 19, a pressing process may be performed. For example, the raw sheet material 200 fixed to the secondary electroformed mold 150 may be subjected to a pressing process. For example, the pressing process may be performed using a pressing roller 250 in which the pressing roller 250 is pushed over the raw sheet material 200 to flatten the UV molding liquid 170 interposed between the secondary electroformed mold 150 and the raw sheet material 200 as well as to cause the UV molding liquid 170 to be closely contacted with the rear surface 210 of the raw sheet material 200.

At operation 20, the UV molding liquid 170 may be cured. For example, the pressed raw sheet material 200 and the UV molding liquid 170 may be cured.

The UV molding liquid 170 may be cured through a reaction with UV rays. For example, the UV molding liquid 170 may be cured by illuminating the UV molding liquid 170 with UV rays. When one surface of the UV molding liquid 170 is formed with the second pattern 160 and the other surface is cured in a state in which the raw sheet material 200 is closely contacted with the other surface, the UV molding liquid 170 formed with the second pattern 160 may be adhered and bonded to the raw sheet material 200. As a result, when a hair line which is the second pattern 160 is formed on the front surface 220 of the raw sheet material 200, a texture may be implemented on the front surface 220 of the raw sheet material 200.

At operation 21, the raw sheet material 200 formed with the second pattern 160 may be separated from the secondary electroformed mold 150. As a result, the raw sheet material 200 may be formed with a hairline on the front surface 220 and a check pattern on the rear surface 210.

At operation 22, a post process may be performed. As the post process, for example, multi-deposition and black printing may be performed on the rear surface 210 of the raw sheet material 200. The multi-deposition may be performed in a chamber in which the color of the raw sheet material 200 may be determined depending on a medium of on the rear surface 210 of the raw sheet material 200 and a pigment added thereto. By applying such a multi-deposition, various colors may be implemented on the raw sheet material 200.

After the multi-deposition, a printing layer may be formed on the rear surface 210 of the raw sheet material so as to implement a mirror-like effect on the front surface 220 of the raw sheet material 200, the visibility of the check pattern formed on the rear surface 210 of the raw sheet material may be further enhanced, and a light transmission/interruption function may be implemented.

Figure 8:
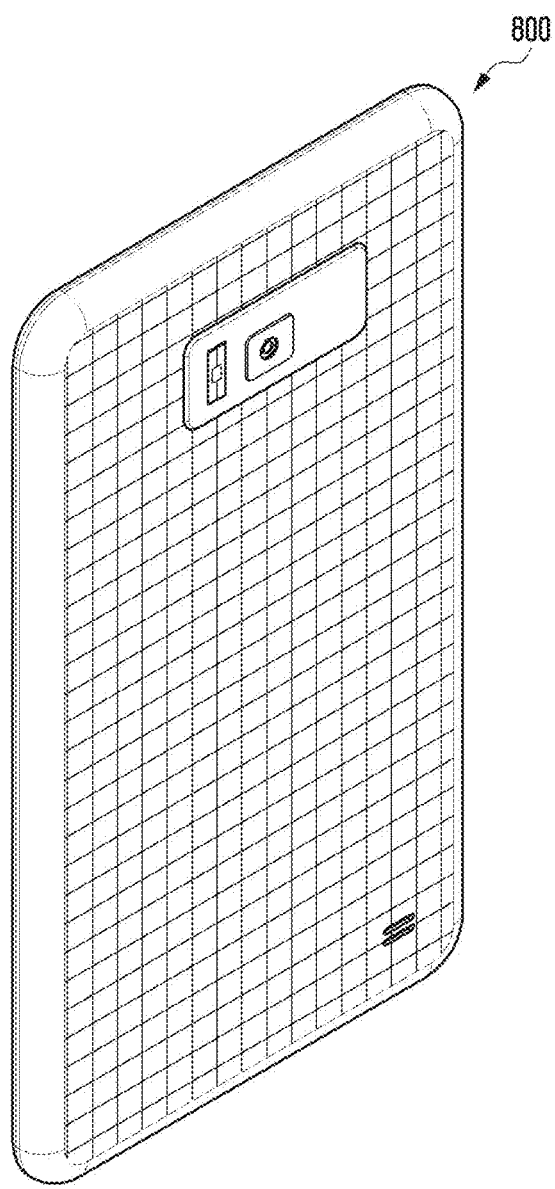
FIG. 8 is a view illustrating an electronic device case which is a resultant item according to various embodiments of the present disclosure.

At least one of mechanical machining using a Numerical Control (NC) machine, or a Computer Numerical Control (CNC) machine, laser machining, pressing machining, and/or the like is performed to cut an outer contour line of the raw sheet material 200 formed through the above-described procedure and outserting is performed to attach the raw sheet material 200 to the electronic device case, thereby completing the electronic device case illustrated in FIG. 8.

A method according to an embodiment of the present disclosure may perform an insert (so-called "IML") injection molding process as follows: the raw sheet material is inserted into a space between the top and bottom molds and then, the top and bottom molds are pressed by a press while a synthetic resin is introduced into the space between the top and bottom molds so that a resin layer is laminated on the rear surface of the machined raw sheet material in the space between the top and bottom molds, thereby molding an injection molded product as an electronic device case.

A method according to an embodiment of the present disclosure may perform an inmold (so-called "IMD") injection molding process as follows: the machined raw sheet material is inserted into a space between the top and bottom molds, a cylinder filled with a resin is connected to a press and then, the cylinder is compressed to introduce the resin within the cylinder into the space between the top and bottom mold while the molds are being pressed by the press.

FIG. 3 illustrates a flow of process for surface treatment of an electronic device case according to another embodiment of the present disclosure.

Referring to FIG. 3, a Ultra-Violet (UV) molding liquid 320 is coated on a raw sheet material 310 that rests on a mold 300 in a process of FIG. 3 in contrast to a process of FIG. 2. Because the process of FIG. 3 is substantially identical with FIG. 2, a description thereof is omitted herein.

At operation 31, the UV molding liquid 320 may be coated on the front surface of the raw sheet material 310.

At operation 32, a top mold 330 on which the first pattern is formed may press the front surface of the raw sheet material 310 that is coated by the UV molding liquid 320.

At operation 33, the raw sheet material 310 and the UV molding liquid 320 may be cured, and then the top mold 330 may be separated from the front surface of the raw sheet material 310.

At operation 34, the mold 300 may be separated from the raw sheet material 310, and the first pattern may be formed on the front surface of the raw sheet material 310.

At operation 35, the UV molding liquid 370 may be coated on the rear surface of the raw sheet material 310.

At operation 36, a bottom mold 350 on which a second pattern is formed may press the rear surface of the raw sheet material 310 that is coated by the UV molding liquid 370.

At operation 37, the raw sheet material 310 and the UV molding liquid 370 may be cured, and then the bottom mold 350 may be separated from the rear surface of the raw sheet material 310.

At operation 38, the mold 360 may be separated from the raw sheet material 310, and the second pattern may be formed on the rear surface of the raw sheet material 310.

Figure 4:
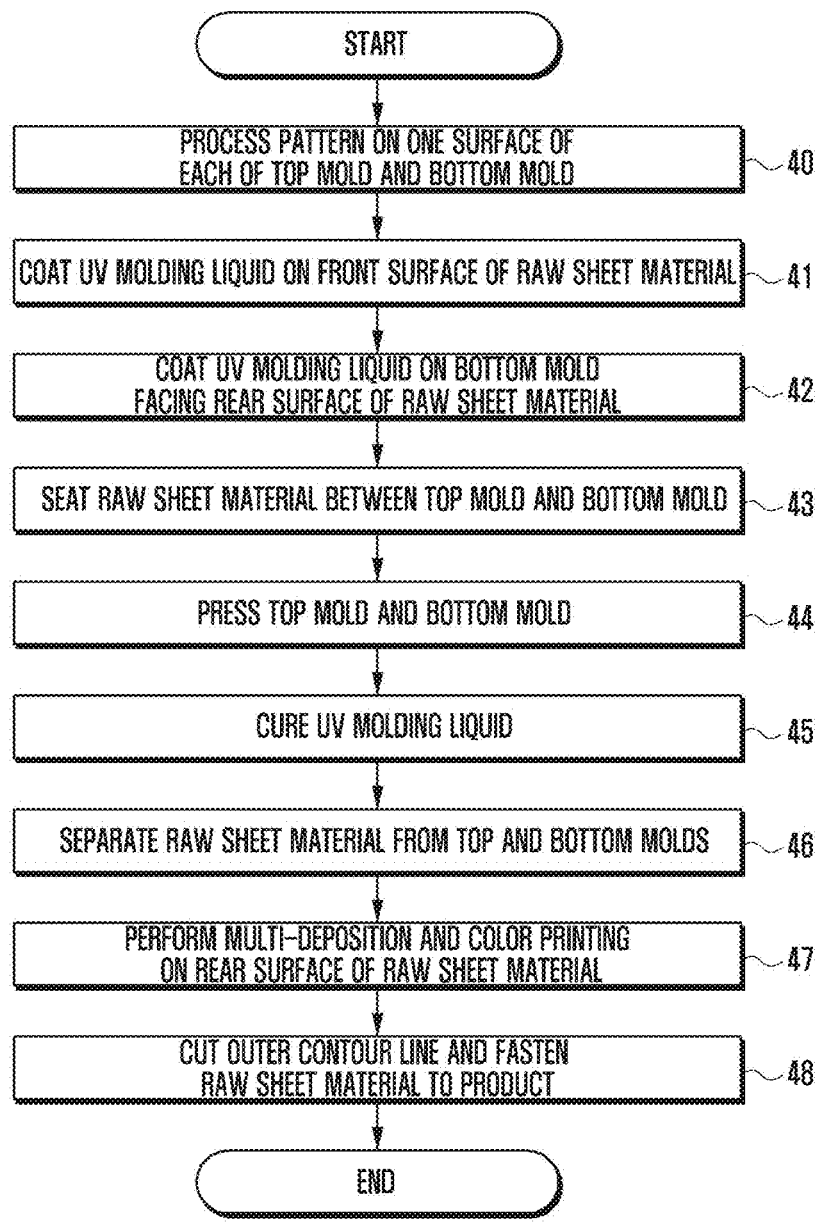
FIG. 4 is a flowchart for describing a surface treatment method of an electronic device case according to an embodiment of the present disclosure.
Figure 5:
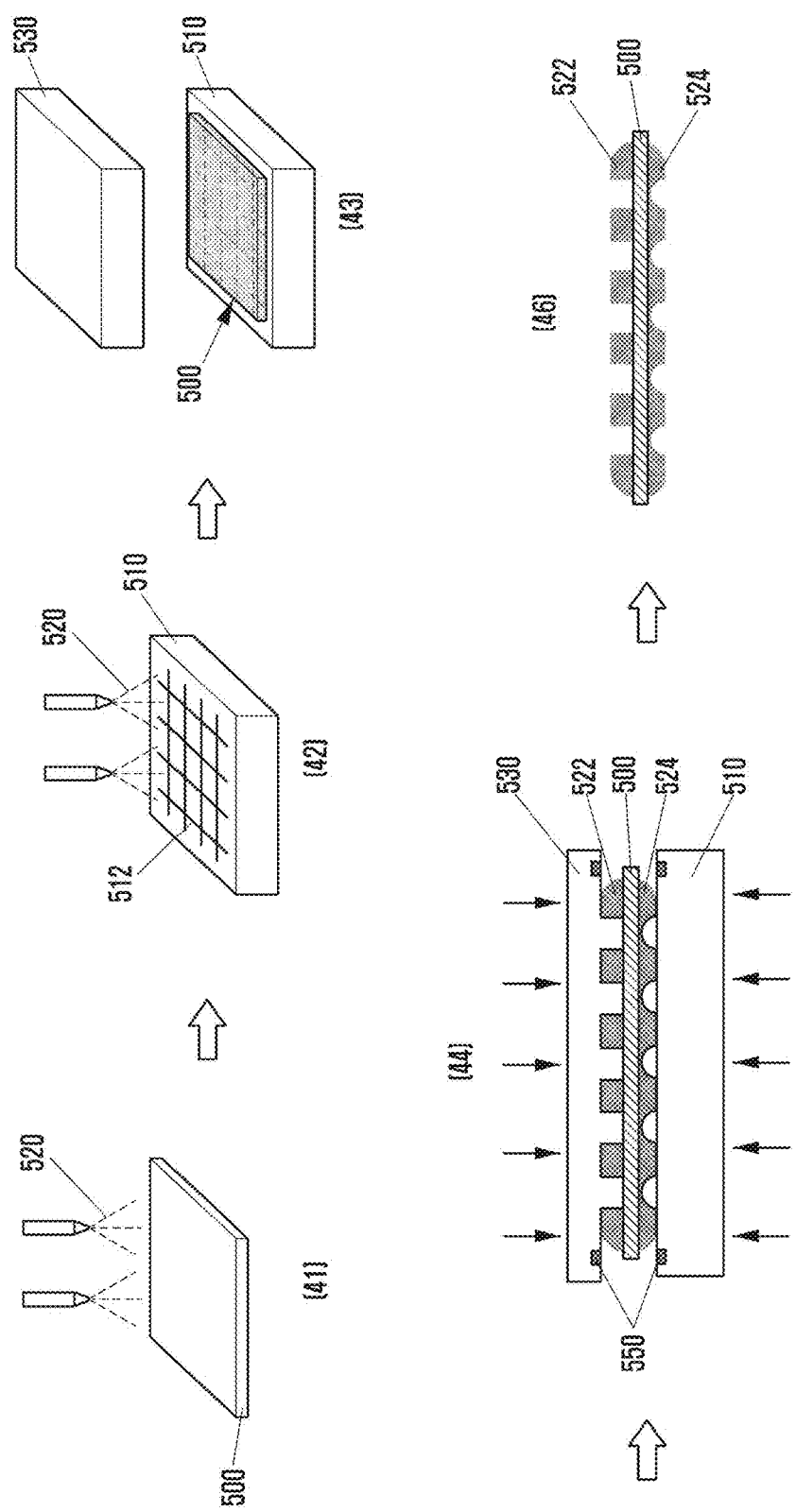
FIG. 5 illustrates a flow of a process for surface treatment of an electronic device case according to an embodiment of the present disclosure.
Figure 6:
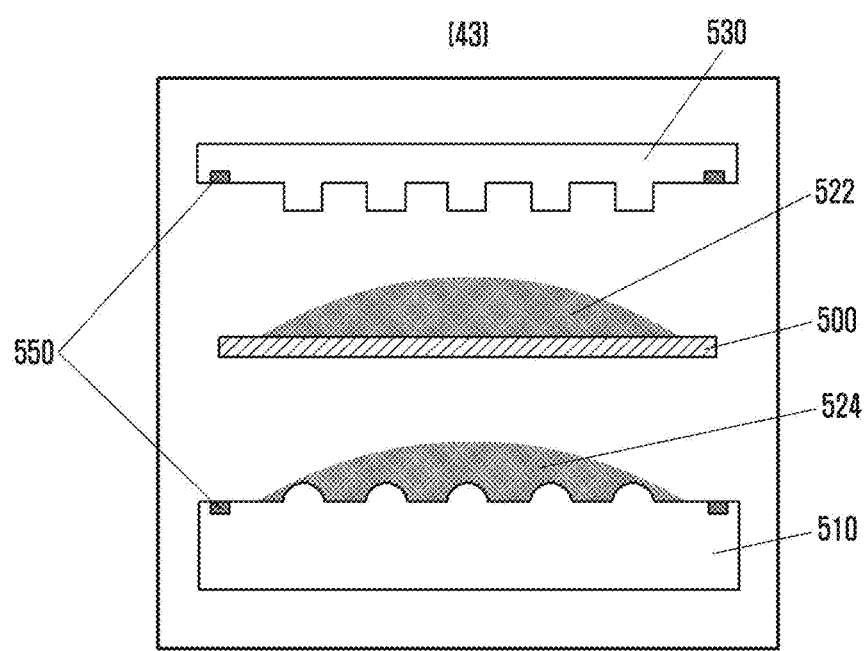
FIG. 6 is a cross-sectional view of a process in which some steps in a process flow such as, for example, the process flow illustrated in FIG. 5 are illustrated as cross-sectional views according to an embodiment of the present disclosure.
Figure 7:
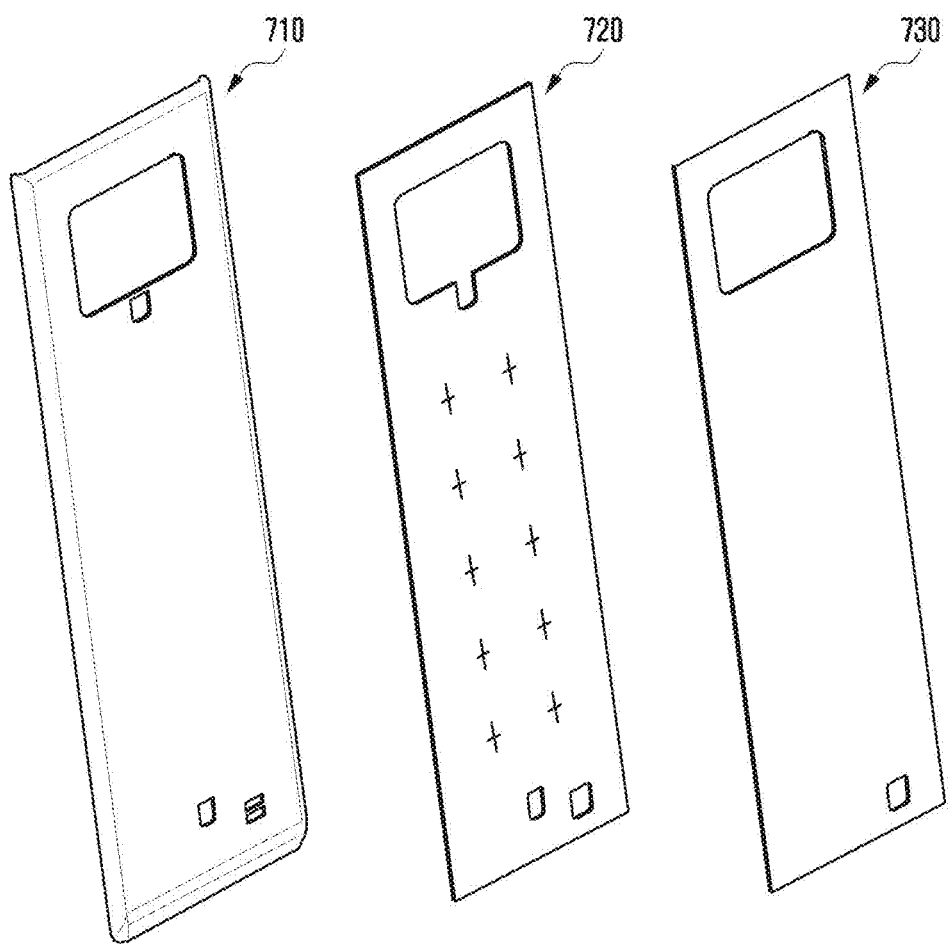
FIG. 7 is a view exemplifying a post process after a surface treatment of an electronic device case according to an embodiment of the present disclosure.

Hereinafter, a surface treatment method of an electronic device case according to an embodiment of the present disclosure will be described with reference to FIGS. 4 to 8. FIG. 4 is a flowchart for describing a surface treatment method of an electronic device case according to an embodiment of the present disclosure. FIG. 5 illustrates a flow of a process for surface treatment of an electronic device case according to an embodiment of the present disclosure. FIG. 6 is a cross-sectional view of a process in which some steps in a process flow such as, for example, the process flow illustrated in FIG. 5 are illustrated as cross-sectional views according to an embodiment of the present disclosure. FIG. 7 is a view exemplifying a post process after a surface treatment of an electronic device case according to an embodiment of the present disclosure. FIG. 8 is a view illustrating an electronic device case which is a resultant item according to an embodiment of the present disclosure.

Referring to FIGS. 4 and 5, at operation 40, the surface treatment method of an electronic device case may process a first pattern on one surface of a bottom mold 510 and a second pattern on one surface of a top mold 530.

For example, the bottom mold 510 and the top mold 530 may be respectively formed with a first pattern and a second pattern, on one surface of each of them, through an electroforming process to have a relief form, an intaglio form or a mixed form thereof formed through electroforming. The first pattern and the second pattern may be formed on the whole or a part of the bottom mold 510 and the top mold 530, respectively. The first pattern and the second pattern may be at least one of a check pattern, a hologram (interference pattern), a spin (rotary pattern), a hairline (stripe pattern), and/or the like. An example of an embodiment of the present disclosure in which the check pattern is set as the first pattern and the hairline is set as the second pattern will be described.

At operation 41, a UV molding liquid 520 may be coated on the front surface of the raw sheet material 500.

The UV molding liquid 520 refers to a material which may act on a photochemical reaction by a UV energy (e.g., a UV ray having a wavelength of 100 nm to 400 nm) to be cured from a liquid phase to a solid phase and dried. The UV molding liquid 520 may be instantly cured by instant illumination of UV rays and may form a very excellent film. According to various embodiments of the present disclosure, the UV molding liquid 520 may include of a photo-polymerizable resin (e.g., an oligomer and a reactive diluent), a photo-polymerization initiator, a pigment, auxiliary agents (e.g., a viscosity improvement agent, an oxidation inhibitor, a wetting agent, and a dispersion agent), a polymerization agent, and a sensitizer. For example, the UV molding liquid 520 may consist of a photo-polymerizable resin (e.g., an oligomer and a reactive diluent), a photo-polymerization initiator, a pigment, auxiliary agents (e.g., a viscosity improvement agent, an oxidation inhibitor, a wetting agent, and a dispersion agent), a polymerization agent, and a sensitizer.

At operation 42, the bottom mold 510 may be coated with the UV molding liquid 520. For example, the UV molding liquid 520 may be coated on the bottom mold 510 where the check pattern 512 is carved.

At operation 43, the raw sheet material 500 may be seated (e.g., disposed) in a space between the top mold 530 and the bottom mold 510.

Referring to FIG. 6, the raw sheet material 500 may be positioned in such a manner that the rear surface of the raw sheet material 500 faces the bottom mold 510 coated with the UV molding liquid 520 and the front surface of the raw sheet material 500 faces the surface of the top mold 530 formed with the second pattern.

At operation 44, the top mold 530 and the bottom mold 510 may be pressed to each other. When the top mold 530 and the bottom mold 510 are pressed, the UV molding liquid 520 coated on the front surface of the raw sheet material 500 and one surface of the top mold 530 are adhered to each other and the UV molding liquid 520 coated on one surface of the bottom mold 510 and the rear surface of the raw sheet material 500 may be adhered to each other. As a result, the UV molding liquid 522 may be adhered to the rear surface of the raw sheet material 500 as the check pattern and the UV molding liquid 524 may be adhered to the front surface of the raw sheet material 500 as the hairline.

When the process of forming the patterns on the raw sheet material 500 using pressing force of the top mold 530 and the bottom mold 510 by simultaneously pressing the top mold 530 and the bottom mold 510 to each other as described above, a roller process may be omitted, thereby realizing the simplification of the entire process.

In addition, when the patterns are formed on the front surface and the rear surface of the raw sheet material 500 simultaneously rather than sequentially forming the patterns on the front surface and rear surface of the raw sheet material 500, a process time and the number of steps in the process may be reduced and thus, yield may be improved.

Further, when the top and bottom molds are simultaneously pressed to each other to spread the UV molding liquid, the UV molding liquid may be evenly distributed and occurrence of a positional deviation, which may be caused when the patterns desired to be formed on the front surface and the rear surface raw of the sheet material 500 are shifted or pushed out, may be suppressed, thereby ensuring that the patterns of the front surface and the rear surface may have uniformity.

Further, the surface treatment method according to various embodiments of the present disclosure forms the patterns on the raw sheet material without moving the raw sheet material in order to form the patterns by simultaneously pressing the top and bottom molds. As a result, a factor, which causes a surface appearance to go bad due to inclusion of foreign matter during the movement of the raw sheet material, may be prevented.

At operation 45, the UV molding liquid 520 may be cured. When the UV molding liquid 520 is cured, the UV molding liquid 524 adhered to the front surface and the UV molding liquid 522 adhered to the rear surface raw of the sheet material 500 may be strongly bonded to the sheet material 500.

Each of the top mold 530 and the bottom mold 510 may include a UV Light Emitting Diodes (LED) at a part thereof. For example, each of the top mold 530 and the bottom mold 510 may be mounted with a UV LED in the form of a UV lamp 550 at each side thereof.

Specifically, when the top mold 530 and the bottom mold 510 are closed, the UV lamps 550 may be operated to cure the UV molding liquid. In this manner, the curing condition for a process may be standardized. The light emitted from the UV lamps 550 may be reflected (e.g., totally reflected) to the raw sheet material in the state in which the top mold 530 and the bottom mold 510 are pressed to each other so that the UV molding liquid 520 may be evenly cured. As a result, the hairline that makes the front surface of the raw sheet material 500 have a texture and the check pattern 512 that makes the rear surface of raw sheet material 500 have a feeling of depth may be simultaneously formed.

At operation 46, the raw sheet material 500 may be separated from the top mold 530 and the bottom mold 510. As a result, the sheet material 500 given an esthetic sense (e.g., look and feel) and a three-dimensional effect may be formed.

At operation 47, as a post process, for example, a multi-deposition and black printing may be performed on the rear surface of the raw sheet material 500. The multi-deposition may be performed in a chamber in which the color of the raw sheet material 500 may be determined depending on a medium of the rear surface of the raw sheet material 500 and a pigment added thereto. By applying such a multi-deposition, various colors may be implemented on the raw sheet material 500.

After the multi-deposition, a printing layer may be formed on the rear surface of the raw sheet material 500 so as to implement a mirror-like effect on the front surface of the raw sheet material 500, and the visibility of the check pattern formed on the rear surface 210 of the raw sheet material may be further enhanced. In addition, a light transmission/interruption function may be implemented through the printing. At least one of mechanical machining using an NC machine, or a CNC machine, laser machining, pressing machining, and/or the like is performed to cut an outer contour line of the raw sheet material 500 formed through the above-described procedure. As a result, a UV molding applied deco may be obtained.

Referring to FIG. 7, at operation 48, an outer contour line may be cut and the raw sheet material 500 may be fastened to the product. For example, an electronic device case may be formed when the UV molding applied deco 730 is attached or fastened to an electronic device case 710 using a tape 720, bonding, and/or the like. For example, as illustrated in FIG. 8, an electronic device case 800 may be completed. FIG. 7 illustrates a process of attaching the UV molding applied deco 730 to the electronic device case 710 through outserting.

A method according to an embodiment of the present disclosure may perform an insert (so-called "IML") injection molding process as follows: the raw sheet material is inserted into a space between the top and bottom molds and then, the top and bottom molds are pressed by a press while a synthetic resin is introduced into the space between the top and bottom molds so that a resin layer is laminated on the rear surface of the machined raw sheet material in the space between the top and bottom molds, thereby molding an injection molded product as an electronic device case.

A method according to an embodiment of the present disclosure may perform an inmold (so-called "IMD") injection molding process as follows: the machined raw sheet material is inserted into a space between the top and bottom molds, a cylinder filled with a resin is connected to a press and then, the cylinder is compressed to introduce the resin within the cylinder into the space between the top and bottom mold while the molds are being pressed by the press.

When molding is applied to the opposite surfaces of the raw sheet material by the surface treatment method of an electronic device case according to various embodiments of the present disclosure as described above, various design effects may be obtained with a single piece. As a result, a three-dimensional effect may be given to the electronic device case and visibility of a pattern may be improved, thereby implementing visual beauty.

Various embodiments of the present disclosure simultaneously process the front surface and the rear surface of a raw sheet material in order to form patterns on an electronic device case. As a result, a process time may be shortened to increase a producing amount and to reduce a cost.

Various embodiments of present disclosure press the top mold and the bottom mold so as to simultaneously form patterns on the front surface and the rear surface of a raw sheet material. As a result, the UV molding liquid may be evenly distributed, occurrence of a positional deviation between the front surface and the rear surface may be prevented, and a factor, which causes a surface appearance to go bad due to inclusion of foreign matter during the movement of the raw sheet material, may also be prevented.

Various embodiments of the present disclosure mounts UV lamps on molds and the UV molding liquid may be cured using a phenomenon of the light emitted from the UV lamps being totally reflected to the raw sheet material when the molds are closed. As a result, a curing condition for a process may be standardized.

Referring to FIGS. 7 and 8, the electronic device case according to the present disclosure includes a case body 710 and a deco 730 attached to the case body 710. The deco 730 may be made of a raw sheet material which includes, on an outwardly exposed surface thereof, a first pattern exhibiting a texture based on a relief form, an intaglio form, a mixed form thereof, or the like, and, on a rear surface thereof, a second pattern overlapped with the first pattern on a vertical line to express a feeling of depth.

The first pattern is formed on one exposed side of the raw sheet material as a hairline and the second pattern is formed on the other side of the raw sheet material as a check pattern, in which the first and second patterns may be made of a UV molding liquid cured on each side of the raw sheet material.

An adhesive layer 720 may be further included between the case body 710 and the deco 730 in which the adhesive layer 720 is made of at least one of a tape, bonding and a synthetic resin.

Surface treatment methods of an electronic device case according to the various embodiments of the present disclosure have been described above with reference to the drawings and specific terms have been used. However, the description and terms have been used in a general meaning merely to easily describe the technical contents of the present disclosure and to help the understanding of the present disclosure and the present disclosure is not limited to the various embodiments as described above. For example, it is apparent to those skilled in the art that other various embodiments based on the technical idea of the present disclosure can be implemented.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A surface treatment method of a case for an electronic device, the surface treatment method comprising:
   processing a first pattern on a surface of a top mold and a second pattern on a surface of a bottom mold;
   coating an Ultra-Violet (UV) molding liquid on each of a front surface of a raw sheet material and the bottom mold facing a rear surface of the raw sheet material;
   positioning the raw sheet material between the top mold and the bottom mold;
   pressing the top mold and the bottom mold to each other;
   curing, when the top mold and the bottom mold are closed, the UV molding liquid by turning on UV light emitting diode (LED) lamps mounted at a side of the top mold and at a side of the bottom mold so that light emitted from the UV LED lamps is totally reflected to the raw sheet material;
   separating the raw sheet material from the top mold and the bottom mold; and
   forming a print layer on at least one of the front surface and the rear surface of the raw sheet material,
   wherein the first pattern and the second pattern are asymmetrical.

2. The method of claim 1, further comprising:
   cutting an outer contour line of the raw sheet material by performing at least one of mechanical machining using a Numerical Control (NC) machine or a Computer Numerical Control (CNC) machine, laser machining, and pressing using a press on the raw sheet material formed with the print layer; and
   attaching the raw sheet material with the cut outer contour line to a body of the case.

3. The method of claim 1, further comprising:
   cutting an outer contour line of the raw sheet material by performing at least one of mechanical machining using a Numerical Control (NC) or a Computer Numerical Control (CNC) machine, laser machining, and pressing using a press on the raw sheet material formed with the print layer; and
   molding an injection-molded item as the case by inserting the raw sheet material into a space between the top mold and the bottom mold, then introducing a synthetic resin into the space between the top mold and the bottom mold, and pressing the top mold and the bottom mold to each other so that a resin layer is laminated on the rear surface of the raw sheet material.

4. The method of claim 1, further comprising:
   cutting an outer contour line of the raw sheet material by performing at least one of mechanical machining using a Numerical Control (NC) or a Computer Numerical Control (CNC) machine, laser machining, and pressing using a press on the raw sheet material formed with the print layer; and
   molding an injection-molded item as the case by inserting the raw sheet material into a space between the top mold and the bottom mold, connecting a cylinder filled with a resin to a press, and then compressing the cylinder by pressing the top mold and the bottom mold by the press so that the resin within the cylinder is introduced into the space between the top mold and the bottom mold.

5. The method of claim 1, wherein, when the first pattern is processed on the surface of the top mold and the second pattern is processed on the surface of the bottom mold, a hairline is processed on the surface of the top mold that faces the front surface of the raw sheet material and a check pattern is processed on the surface of the bottom mold that faces the rear surface of the raw sheet material.

6. The method of claim 5, wherein, when the raw sheet material is positioned between the top mold and the bottom mold and pressed, the UV molding liquid is adhered to the front surface of the raw sheet material as the hairline and the UV molding liquid is adhered to the rear surface of the raw sheet material as the check pattern.

7. The method of claim 1, further comprising:
   performing a multi-deposition on the rear surface of the raw sheet material.

* * * * *